US012802740B2

(12) United States Patent
Mazumder

(10) Patent No.: US 12,802,740 B2
(45) Date of Patent: Nov. 17, 2026

(54) CLOCK TRANSMISSION CIRCUITRY FOR A MULTI-CHIP RAM

(71) Applicant: Micron Technology, Inc., Boise, ID (US)

(72) Inventor: Kallol Mazumder, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 19/063,248

(22) Filed: Feb. 25, 2025

(65) Prior Publication Data

US 2025/0378868 A1 Dec. 11, 2025

Related U.S. Application Data

(60) Provisional application No. 63/656,678, filed on Jun. 6, 2024.

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096
USPC ...................................................... 365/233.1
See application file for complete search history.

(56) References Cited

U.S. PATENT DOCUMENTS

| | | | | |
|---|---|---|---|---|
| 8,848,473 | B2 | 9/2014 | Nishioka | |
| 11,211,103 | B1 | 12/2021 | Mazumder et al. | |
| 2019/0320085 | A1 * | 10/2019 | Foley | G03G 15/0865 |
| 2025/0299761 | A1 * | 9/2025 | Lee | G11C 29/32 |

* cited by examiner

*Primary Examiner* — Ly D Pham
(74) *Attorney, Agent, or Firm* — Fletcher Yoder, P.C.

(57) ABSTRACT

Devices and methods include a first memory chip including first memory banks, a command input configured to receive a command and a chip identifier, and a decoder configured to determine whether the command is to use a clock on the second memory chip when the command matches predetermined conditions. The devices and methods also include a second memory chip including second memory banks and a clock receiver configured to receive the clock from the first memory chip to be used in memory operations on the second memory chip. The first memory chip acts a base chip for a stack of memory chips that includes the first memory chip and the second memory chip. When the command matches the predetermined conditions, the first memory chip is configured to send the chip identifier to the second memory chip to the clock receiver to activate the clock receiver before transmitting the command to the second memory chip.

14 Claims, 8 Drawing Sheets

CLOCK TRANSMISSION CIRCUITRY FOR A MULTI-CHIP RAM

CROSS-REFERENCE TO RELATED APPLICATION

This application claims priority to U.S. Provisional Application No. 63/656,678, filed Jun. 6, 2024, which is incorporated by reference herein in its entirety.

BACKGROUND

Field of the Present Disclosure

Embodiments of the present disclosure relate generally to the field of memory devices. More specifically, embodiments of the present disclosure relate to using a part of a command to control a burst clock for the memory device.

Description of Related Art

Memory devices may include multiple chips in a stacked design. A clock may be intra-chip. The clock may run freely and/or may be wakened in situations where it is to be used using a wake signal. When a wake signal (e.g., a chip select (CS) signal) is received at a memory device, the memory device may awaken the clock. The memory device may keep the command burst clock running until a maintain signal is fed back from a command/control logic area. However, this maintain signal may take a relatively long time to return due to various factors. For example, the command may span multiple cycles causing delay in propagation and decoding of the entire command. Furthermore, various different modes such as gear down or power down modes may complicate the decoding. Thus, generally, the clock may run freely most of the time that the memory device is powered on. Specifically, a delay in matching a stack identifier (stackID) identifying a specific chip to a chip identifier (chipID) makes enabling the clock after detecting a specific rank that a command targets impractical or impossible. This delay makes it difficult to transmit the clock from a base chip (Rank0) at the appropriate time.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, memory devices may use certain signals (e.g., chip select (CS)/chipID signals) to wake up certain aspects of the memory device, such as clock propagation. Targeted enabling/disabling of the clock (CLK) may be implemented by partitioning logic that uses CLK between Rank0 (e.g., base die/chip) and other ranks (e.g., Rank1, Rank2, etc.) in a stack of memory chips. Thus, the necessary clocked-logic on Rank0 may be performed initially, allowing sufficient time to wake up the CLK for other ranks and then continue the clocked-logic operation on the targeted rank. Such implementation enables a significant reduction in the amount of delay on the intra-chip CLKs. As noted below, the use of this delay to mimic the ChipID/StackID match combinational logic delay required to match the ChipID and the StackID may be at least partially obviated.

Figure 1:
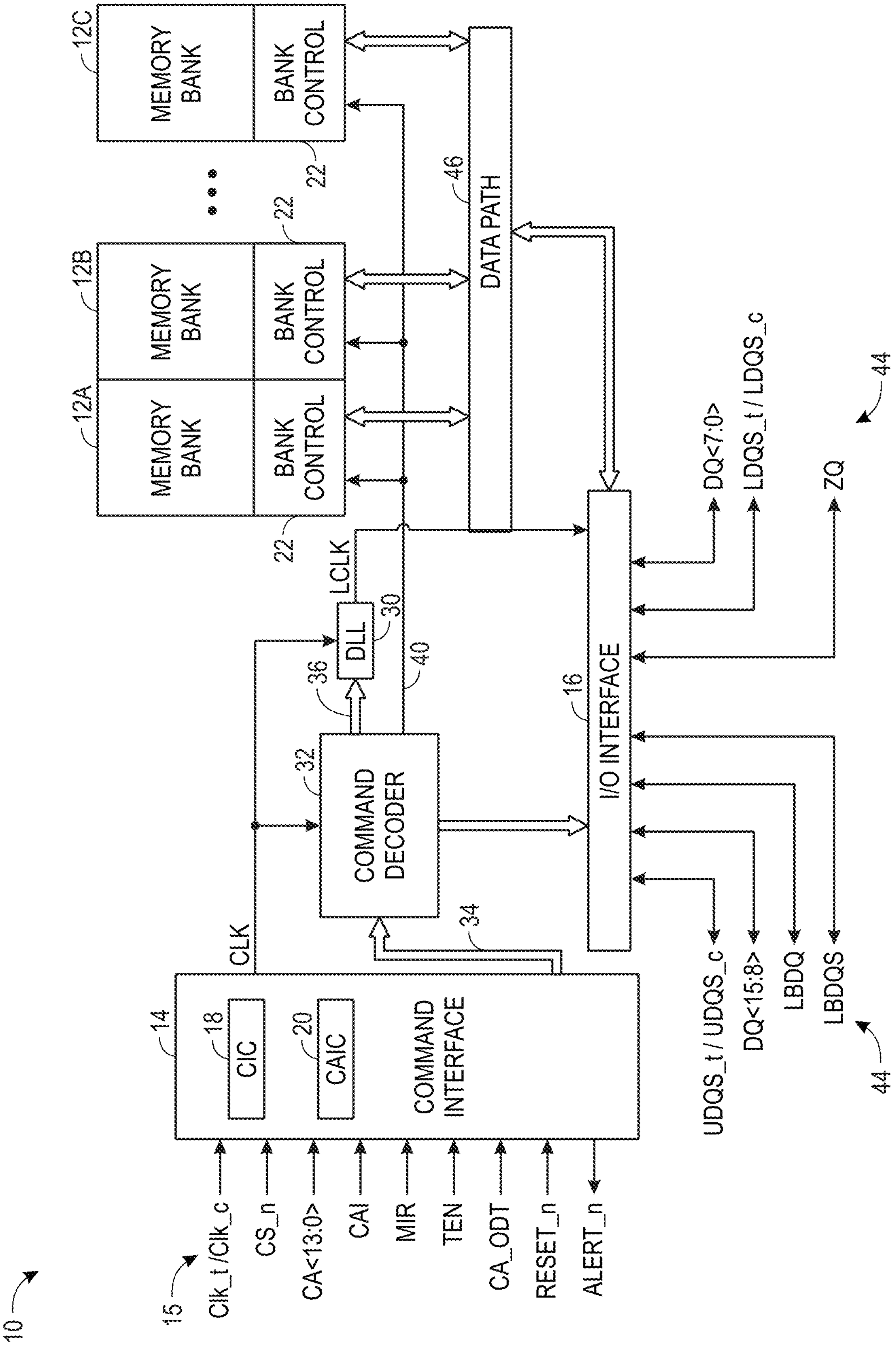
FIG. 1 is a simplified block diagram illustrating certain features of a memory device having multiple memory chips, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12 (individually referred to as memory banks 12A, 12B, and 12C). The memory banks 12 may be DDR5 SDRAM memory banks, for instance. The memory banks 12 may be provided on one or more chips/die (e.g., SDRAM chips) that are arranged on dual inline memory modules (DIMMS). For instance, the different chip may be stacked in a three-dimensional stack to form 3D RAM. Each DIMM may include a number of SDRAM memory chips (e.g., x8 or x16 memory chips), as will be appreciated. Each SDRAM memory chip may include one or more memory banks 12 and/or each of the memory banks 12 may be included on different memory chips. Additionally or alternatively, the memory device 10 represents a portion of a single memory chip (e.g., SDRAM chip) having a number of memory banks 12. For DDR5, the memory banks 12 may be further arranged to form bank groups and/or ranks. For instance, for an 8 gigabyte (Gb) DDR5 SDRAM, the memory chip may include 16 memory banks 12, arranged into 8 bank groups, each bank group including 2 memory banks in one or more memory ranks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates an internal clock signal LCLK based on the received internal clock signal CLK. The internal clock signal LCLK is supplied to the I/O interface 16, for instance, and is used as a timing signal for determining an output timing of read data. The clock input circuit 18 may also include gating circuitry that is configured to gate the propagation of the received clock to the internal clock to prevent moving voltages of capacitors in the memory device 10 and consuming power. Thus, unless the internal clock is to be used, the clock input circuit 18 may utilize clock gating to block propagation of the internal clock.

The internal clock signal(s) CLK, when propagated, may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the internal clock signal LCLK. The internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control 22 which provides the necessary decoding (e.g., row decoder and column decoder), as well as other features, such as timing control and data control, to facilitate the execution of commands to and from the memory banks 12. For example, the bank control 22 may include clock circuitry that is used to transmit a clock from a base chip (e.g., memory bank 12A) to a targeted chip higher up in the stack of chips (e.g., memory bank 12B).

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

As previously noted, the bank control 22 may include clock circuitry that transmits clocks from a rank0/base chip (e.g., memory chip 12A) to non-rank0/other chip (e.g., memory bank 12B). Some command types, such as write command require a clock shift on the non-rank0 chip. For instance, write (WR), write pattern (WRP), and read and write auto-precharge (RD-AutoP and WR-AutoP) commands use clocks. For instance, the WR and WRP commands use the clock for a read-modify-write state machine, and the RD-AutoP and WR-AutoP latency shifters use the clock. These commands have some common characteristics including that each uses a short version of command to command delay (tCCD_S). For instance, in DDR5, this command separation is 8 clock cycles. However, the total amount of shift for these commands is greater than tCCD_S. Additionally, these commands also have BankIdle being low for the target rank (e.g., rank0 or non-rank0 such as rank1, etc.). For these commands, they have the same bits at command/address bit0 (CA0) and command/address bit1 (CA1) for the first cycle of a command (e.g., "01").

Figure 2:
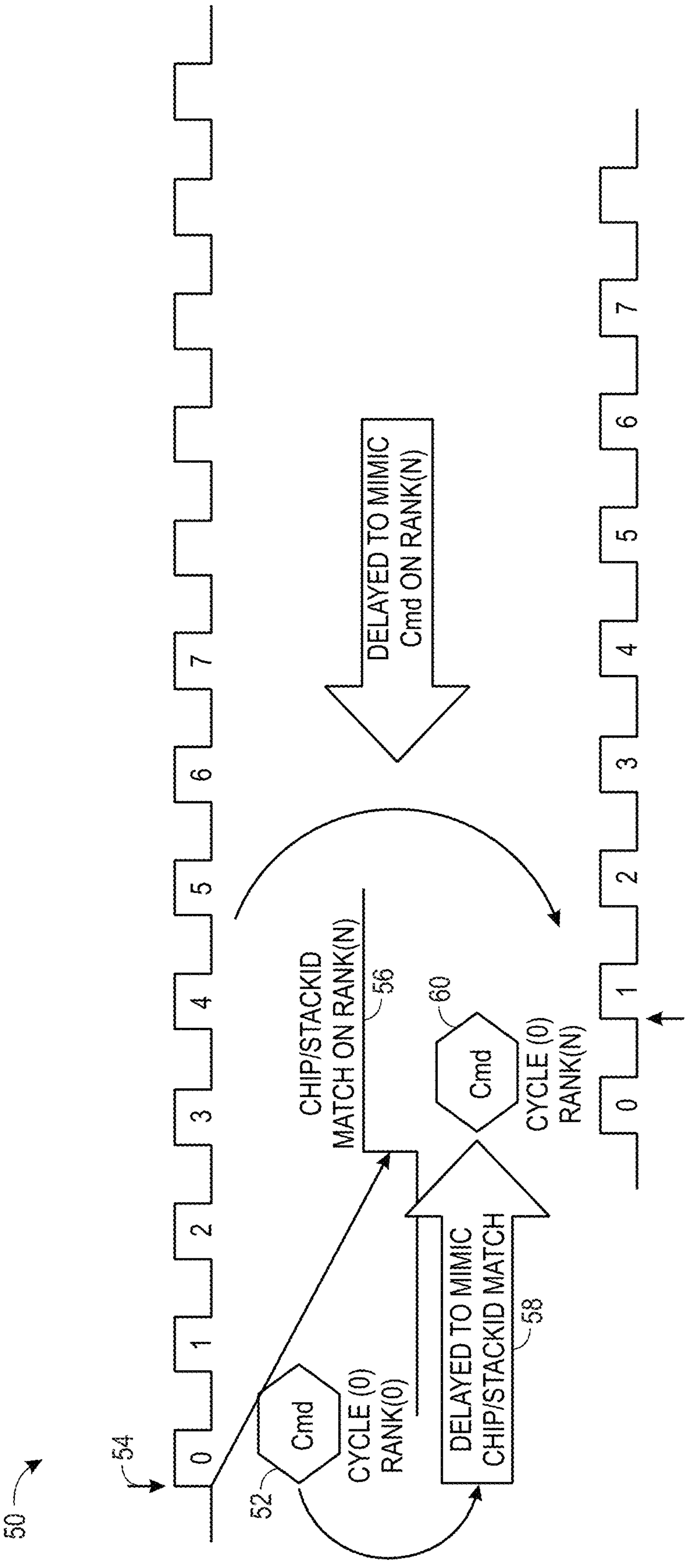
FIG. 2 is a timing diagram using an ungated clock topology on an inter-chip clock between the multiple memory chips of FIG. 1, according to an embodiment of the present disclosure.

FIG. 2 is a timing diagram 50 that may be used in the bank control 22 when the clock topology between the chip is ungated. A received command 52 is received at rank0 at point 54. Chip/StackID circuitry of the bank control 22 matches the chip ID and the stackID, but a resultant firing of the match signal takes a period of time. The match signal pulse 56 may be maintained for some length (e.g., tCCD_S) after the delay. To accommodate this delay, the target rank may be delayed (in delay 58) in parallel to ensure that a delayed command 60 enters a shifter of the chip at the correct cycle. Furthermore, this delay prevents the match signal from being available to wake up the clock across ranks without risking some potential data loss.

Figure 3:
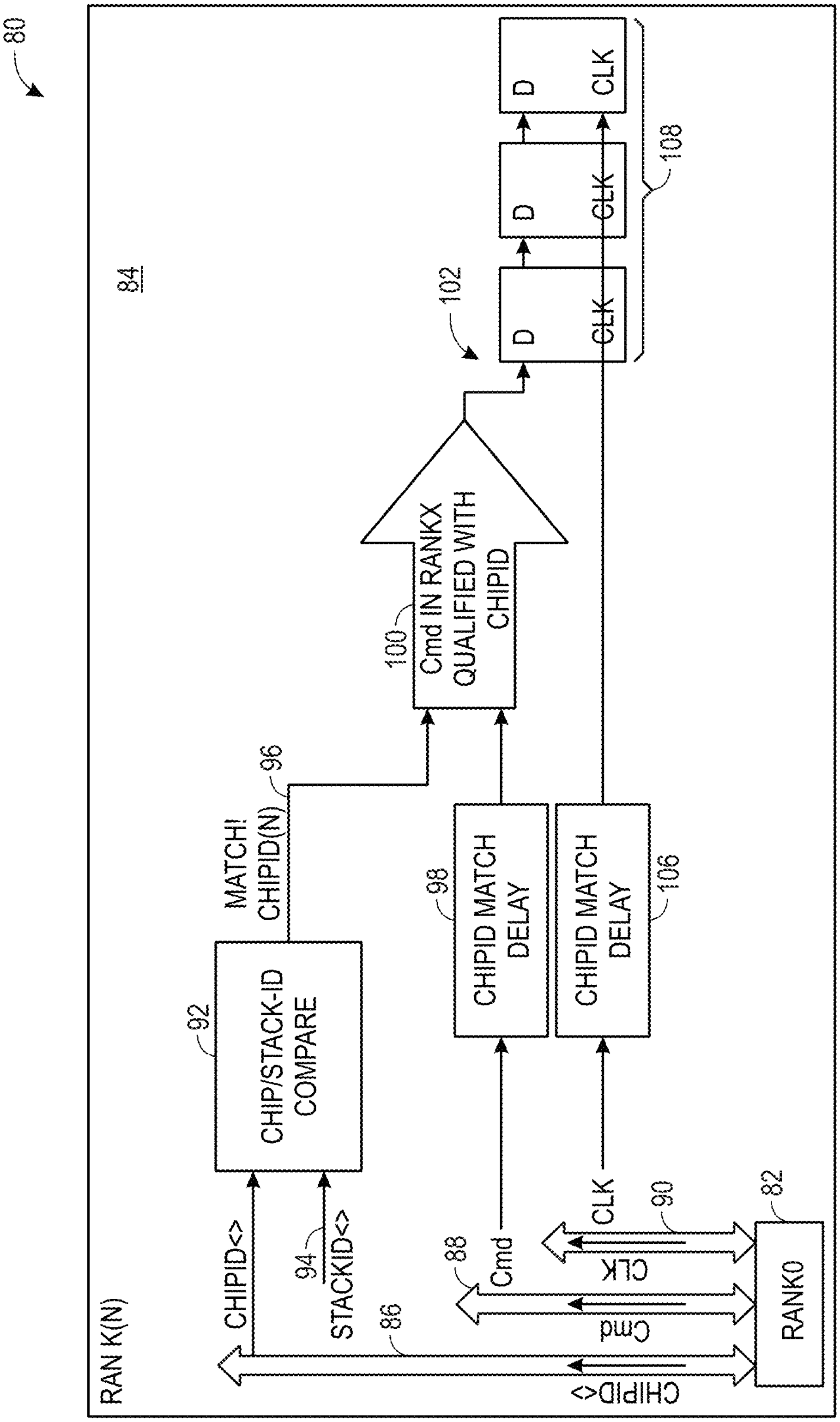
FIG. 3 is a diagram of the ungated clock topology of FIG. 2, according to an embodiment of the present disclosure.

FIG. 3 is a block diagram 80 of inter-rank clock transmission using the bank control 22 using the ungated topology. Rank0 82 (e.g., base chip) shares some signals with rank(n) 84 (e.g., other stacked chip). For example, the rank0 82 shares a chipID 86, a command 88, and a clock 90. As previously noted, the chipID 86 indicates which chip the command 88 is targeting. The chipID 86, the command 88, and the clock 90 are all transmitted from the rank0 82 to the rank(n) 84 at a same cycle (e.g., cycle 0). Chip/stack-ID matching circuitry 92 uses a stackID 94 of the rank(n) 84 to determine whether the command 88 is targeting the rank(n) 84. If the chipID 86 and stackID 94 match, the chip/stack-ID matching circuitry 92 outputs an indication of the match by pulsing a matching signal 96. As previously noted, the rank(n) 84 delays the received command 88 in delay circuitry 98 to match the delay of the chip/stack-ID matching circuitry 92 and the command path to shifters 108. This delayed command is then qualified (e.g., gated) with the chipID 86 due to the matching signal 96 as a qualified command 100. This delayed and matched command 102 is then passed to the shifters 108 that is clocked with the clock after it has been delayed using clock delay circuitry 106 to match the delay in the chip/stack-ID matching circuitry 92/command path to the shifters 108.

As can be seen above, in the ungated topology, the command to rank(n) at cycle 0 is transmitted at cycle 0, but arrival at rank(n) is delayed to match up with the matching delay. Instead of transmitting at cycle 0 and delaying to match the matching delay, the command may be sent at a later cycle that provides timing and/or power advantages over ungated clocking as will be discussed below.

Figure 4:
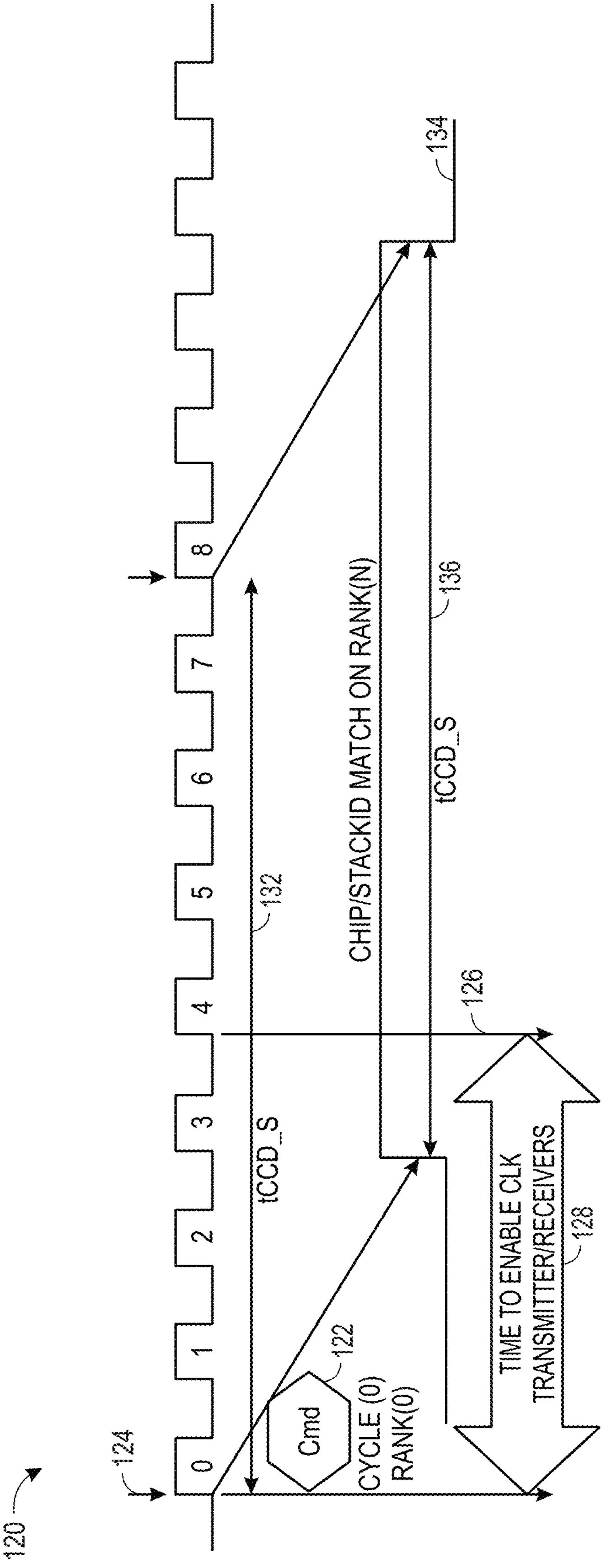
FIG. 4 is a timing diagram using a gated clock topology on an inter-chip clock between the multiple memory chips of FIG. 1, according to an embodiment of the present disclosure.

FIG. 4 is a timing diagram 120 where a command 122 is transmitted later (e.g., after cycle (0)). As illustrated, a command 122 is received at the base chip at a time 124 (e.g., cycle (0)) but transmitted at time 126 that is later than the time 124 by some amount of delay. The delay may be any suitable number of clock cycles that is less than tCCD_S 132. The amount of delay may be sufficient to enable matching of the chipID and the stackID to occur and/or time to generate control signals that enable clock gating across ranks in the memory device 10. For instance, the delay may be greater than or equal to a time 128 sufficient to enable the clock transmitter in bank control 22 of the base/rank0 chip and the clock receivers in the bank control 22 of the non-rank0 chip to receive clocks in non-rank0 chips and/or transmit clocks in rank0 chips. For instance, in the illustrated embodiment, the number of cycles of delay is 4 clock cycles but may be any other suitable number of cycles.

By adding the delay before transmitting the command, the command is naturally delayed until after a pulse 134 on the matching signal begins indicating that the chipID and stackID match. The pulse 134 may be maintained for tCCD_S cycles 136 to provide a sufficiently large valid window to qualify the arriving command at the target rank. Furthermore, the transmission of the command 122 may be decoupled from (e.g., not synchronized with) the pulse 134 to prevent adding intentional delay on the clock travelling across ranks. Additionally, the specification of tCCD_S for DDR5 may provide a naturally large enough qualification window to perform such timings without conflicts.

Figure 5:
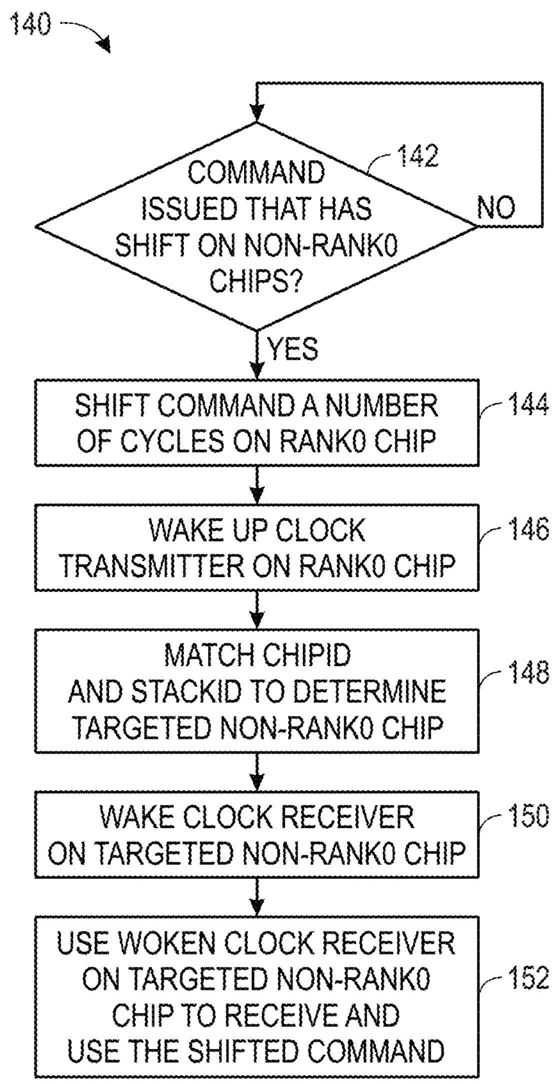
FIG. 5 is a flow chart of a process for using the gated clock topology of FIG. 4, according to an embodiment of the present disclosure.

FIG. 5 is a flow diagram for using a process 140 to gate a clock for gating and transmission of a clock across ranks/chips of the memory device 10. The memory device 10 (e.g., the command decoder 32 and/or bank control 22) determines whether a command has been issued that has a shift on non-rank0 chips (block 142). For instance, the memory device 10 determines whether the issued command is a WR, WRP, auto-precharge command, or any other command that may need clock shifting on the non-rank0 die/chips and/or by using common characteristics (e.g., CA0=0 and CA1=1 with CS=Low). The determination may include determining whether the banks are idle (e.g., BankIdle signal is high) for the entire stack. As such, if the stack is all idle, there is no need to enable the clock transmitter on rank0. If the BankIdle signal is high for the target rank, there is no need to enable the clock receiver at the target rank.

If the command is to be shifted on non-rank0 chips, the bank control 22 of the rank0 chip shifts the command a number of cycles on the rank0 chip (block 144). For instance, the number of cycles may be selected to be some value less than tCCD_S (e.g., 8 cycles). In other words, the number of cycles (n) may be chosen in such a way that the clock wakes up at the target rank before the arrival of the command. In some embodiments, n may be selected based on speed-grade as encoded in a mode register (e.g., MR13). For a larger tCK, n may be smaller while it may be larger for a smaller tCK.

While the command is in progress in rank0, the memory device 10 (e.g., bank control 22 of the base die) wakes the clock transmitter on rank0 (block 146). The bank control(s) 22 of the non-rank0 chips compare the chipID and the stackID to determine a targeted non-rank0 chip based on the chipID and the stackID matching (block 148). The memory device 10 (e.g., bank control 22) of the targeted non-rank0 chip wakes a clock receiver of the targeted non-rank0 chip (block 150). The memory device 10 then uses the woken clock receiver on the targeted non-rank0 chip to receive and use the shifted command to perform the command (block 152).

In some embodiments, when the command is captured at the target rank, a burst-in-progress signal is generated on each rank that travels back to rank0 to maintain the clock transmitter in the enabled state to make sure that the clock remains available for the command, and its transmission to the non-rank0 chip is not shut off prematurely. The burst-in-progress signals from each rank may be ORed together to maintain the enabled state of the clock transmitter. This burst-in-progress signals on any rank maintain the clock receiver in that rank.

Figure 6:
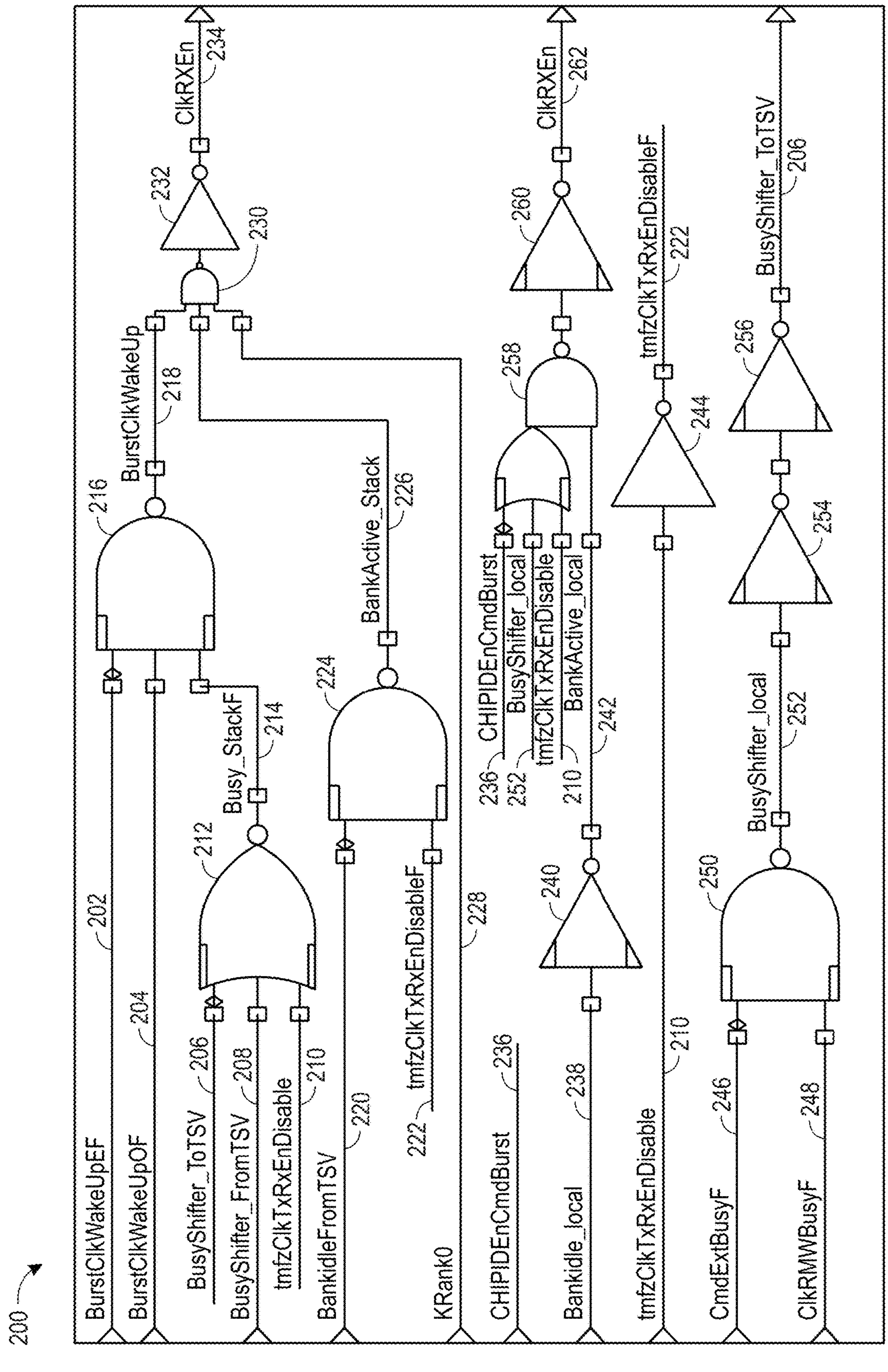
FIG. 6 is a schematic diagram of clock circuitry that is deployed in each of the multiple memory chips of FIG. 1 to enable the clock gating of FIGS. 4 and 5, according to an embodiment of the present disclosure.

FIG. 6 is a circuit diagram of clock circuitry 200 that may be implemented in the bank control 22 of each of the chips (e.g., both rank0 and non-rank0 chips) used to enable and disable the inter-chip transmission of the clock from the rank0 chip and to enable and disable the inter-chip transmission of the clock at each of the non-rank0 chips. The clock circuitry 200 receives a BurstClkWakeUpEF 202 and BurstClkWakeUpOF 204 that are burst clock wake up signals based on decoding CA0 and CA1 along with CS being low on rank0 to detect that the command may require a shift on a non-rank0 chip. This pulse remains active until the burst-in-progress (BIP) can arrive from the rank0 shifters.

The clock circuitry 200 also receives a BusyShifter_ToTSV 206 that is burst-in-progress information of a specific non-rank0 chip that is a logic OR of three sets of shifters: RD-Auto-Precharge, WR/WRP-Auto-Precharge, and the RMW state machine for WR/WRP. For rank0, this will always fire for a burst-in-progress for any rank since the first few cycles of the command always fire on rank0. The clock circuitry 200 also receives BusyShifter_FromTSV 208 that is BIP information as a logical OR of BIP from all rank0 chips in the stack arriving back at the rank0 chip. The clock circuitry 200 may also receive a tmfzClkTxRxEnDisable 210 that is used to enable or disable clock gating using the clock circuitry 200. The tmfzClkTxRxEnDisable 210 may be a fuse option that may be used to disable clock gating entirely and enable the clock transmitter on rank0 and the clock receiver on each rank permanently. For instance, this setting may be changed to override clock gating to recover functionality on the memory device 10 if there is some failure or issue.

The BusyShifter_ToTSV 206, BusyShifter_FromTSV 208, and the tmfzClkTxRxEnDisable 210 are transmitted to a NOR gate 212 that outputs a Busy_StackF 214 that indicates whether the stack is busy with shifters to or from the TSV. The Busy_StackF 214 is transmitted along with the BurstClkWakeUpEF 202 and the BurstClkWakeUpOF 204 to a NAND gate 216 that outputs a BurstClkWakeUp 218 that is based on the CA bits (e.g., CA bits 0 and 1) and other characteristics (e.g., CS=Low) that indicates that a command that needs a shift on a non-Rank0 die and is kept asserted till BIP arrives from rank0 shifters.

The clock circuitry 200 includes a BankIdle_FromTSV 220 that carries the information whether ALL ranks are in a BankIdle state. If the entire Stack has no banks active then there is no possibility of issuing a legal command that needs a shift on a non-rank0 chip. In such a situation, the clock transmitter may be disabled. In some embodiments, this BankIdle_FromTSV 220 has a guaranteed margin of tRCD (e.g., minimum number of clock cycles required between opening a row of memory and accessing columns within it) in this scenario for any shift needed on a non-rank0 chip. Along the BankIdle_FromTSV 220, a tmfzClkTxRxEnDisableF 222 is transmitted to a NAND gate 224. The tmfzClkTxRxEnDisableF 222 is complementary to the tmfzClkTxRxEnDisable 210 and generated using inverter 244. A BankActive_Stack 226 is output from the NAND gate 224 to indicate whether the bank is active or idle.

The clock circuitry 200 also receives KRank0 228 that is a flag generated from die configuration that indicates whether the chip on which each instantiation of the clock circuitry 200 is rank0 or non-rank0. For instance, for rank0 chips, the Krank0 228 may be a first value (e.g., 1 or high) while it is a second value (e.g., 0 or low) for non-rank0 chips. This flag will ensure that a clock transmitter is only enabled on rank0 chips. The BurstClkWakeUp 218, the BankActive_Stack 226, and the KRank0 228 are all transmitted as inputs to a NAND gate 230 that has its output inverted using an inverter 232 to output a ClkTxEn 234 that enables the clock transmitter of a rank0 chip. Using the BurstClkWakeUp 218, the BankActive_Stack 226, and the KRank0 228, the clock transmitter is enabled when all of the suitable conditions are met, such that the characteristics (e.g., CA bits and CS low) are met, and the chip is a rank0 chip. Since the ClkTxEn 234 is anticipatory in nature, it fires whenever an event is detected that may require a command shift in any rank of the stack.

The clock circuitry 200 also receives a CHIPIDEnCmdBurst 236 that carries Chip/StackID match information of the "local" rank on which the clock circuitry 200 is implemented. The CHIPIDEnCmdBurst 236 is combined with the BusyShifter_ToTSV 206. As noted earlier, the CHIPIDEnCmdBurst 236 lasts for tCCD_S cycles that is more than enough time for a local Burst-in-Progress to arrive and maintain a clock receive enable envelope.

As illustrated, the clock circuitry 200 receives a BankIdle_local 238 that carries the BankIdle state information of the local rank on which the clock circuitry 200 is implemented. The BankIdle_local 238 is inverted in an inverter 240 to generate a BankActive_local 242 indicating whether the local rank is active.

The clock circuitry 200 also receives CmdExtBusyF 246 that indicates that the initial partition of shifters is active on rank0 chips where the shifters provide time to wake up the clock. Additionally, the clock circuitry 200 also receives ClkRMWBusyF 248 that indicates that the RMW state machine is busy. The CmdExtBusyF 246 and the ClkRMWBusyF 248 are received at inputs of a NAND gate 250 that outputs an BusyShifter_local 252 that indicates whether any shifters of the local rank are busy. Using a couple of inverters 254 and 256, the clock circuitry 200 generates the BusyShifter_ToTSV 206.

The CHIPIDEnCmdBurst 236, the BusyShifter_local 252, and the tmfzClkTxRxEnDisable 210, and the BankActive_local 242 are input to selection circuitry 258 that has its input inverted in an inverter 260 to generate ClkRxEn 262 that is used to control whether the clock receiver is active. Using the illustrated embodiment, the clock circuitry 200 may enable the ClkRxEn 262 only when BankIdle_local 238 is low for the local rank and the CHIPIDEnCmdBurst 236 or a burst in progress for the local rank is high. As such, the ClkRxEn 262 is rank-specific and fires when an event is detected that requires a command shift in the particular rank of the stack.

Figure 7:
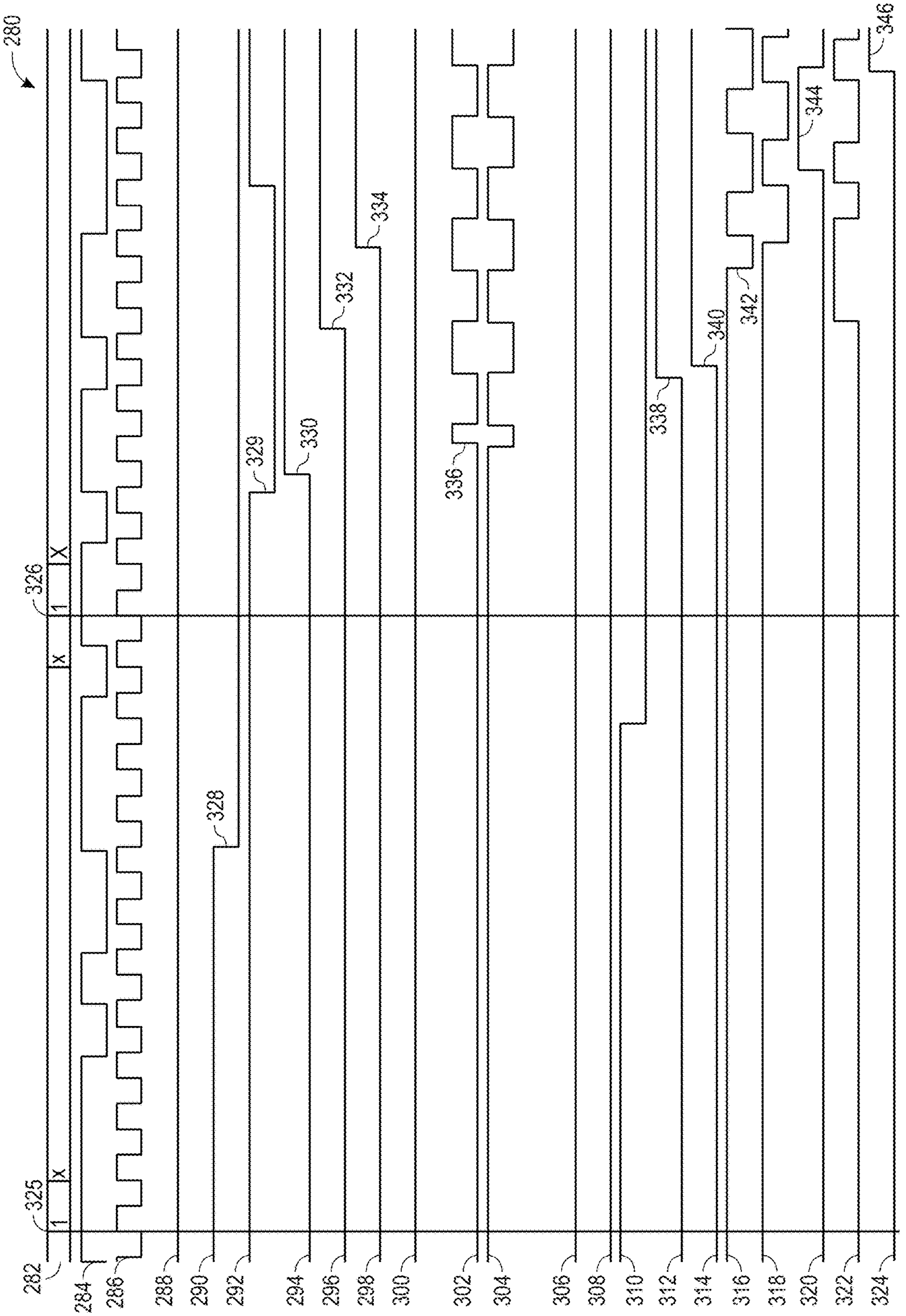
FIG. 7 is a timing diagram of example signals that may be used in the clock circuitry of FIG. 6 to enable clock transmission between the multiple memory chips of FIG. 1, according to an embodiment of the present disclosure.

FIG. 7 is a timing diagram 280 showing timing of the clock circuitry 200 for enabling transmitter and/or clock receivers. The timing diagram 280 includes lines 282, 284, 286, 288, 290, 292, 294, 296, 298, 300, 302, 304, 306, 308, 310, 312, 314, 316, 318, 320, 322, and 324. Lines 288, 290, 292, 294, 296, and 298 correspond to signals of the clock circuitry 200 in a rank0 chip while the lines 306, 308, 310, 312, 314, 316, 318, 320, 322, and 324 correspond to signals of the clock circuitry 200 in non-rank0 chips.

The line 282 corresponds to a latched chipID, the line 284 corresponds to a voltage on a CS pad of the memory device 10, and the line 286 corresponds to a clock of the memory device 10. The line 288 corresponds to the KRank0 228, the line 290 corresponds to the BankIdle_FromTSV 220, and the line 292 corresponds to the BurstClkWakeUp 218. The line 294 corresponds to the ClkTxEn 234, the line 296 corresponds to the BusyShifter_ToTSV 206, the line 298 corresponds to the BusyShifter_FromTSV 208, and the line 300 corresponds to the ClkRxEn 262.

The lines 302 and 304 correspond to even and odd clocks respectively. The line 306 corresponds to the KRank0 228, the line 308 corresponds to the ClkTxEn 234. The line 310 corresponds to the BankIdle_local 242, the line 312 corresponds to the CHIPIDEnCmdBurst 236, and the line 314 corresponds to the ClkRxEn 262. The lines 316 and 318 correspond to even and odd clocks from the TSV. The line 320 corresponds to the late sent command and when it is received at the local rank. The line 322 corresponds to a clock that may be effectively the same as the clock corresponding to the clock of line 318 except that there may be additional logic (not shown) in the generation of the clock corresponding to the line 322. The line 324 corresponds to the command capture at later stages in the shifters.

For the timing diagram 280, the stack has all banks idle in both ranks before the command sequence starts. At time 325, an activate command for rank1 is issued, and at time 326, a WR command is issued for rank1. BankIdle_FromTSV 220 fires at point 328 while the ClkTxEn 234 remains low at rank0 as there is no burst command yet. With the WR event, at point 329, the BurstClkWakeUp 218 fires low toggle the ClkTxEn 234 high at point 330.

At point 332, the BusyShifter_ToTSV 206 fires on rank0 as a result of the initial command shifts on rank0. As illustrated, the BurstClkWakeUp 218 and the BusyShifter_ToTSV 206 may have considerable overlap.

At point 334, the BusyShifter_FromTSV 208 fires due to the command capture/shift on rank1 and the burst-in-progress information returning back to rank0 from rank1. The CLK travelling across ranks wakes at time 336. In some embodiments, an initial pulse may be corrupted but without a command arriving at such time, the commands will be captured properly cycles later due to the late broadcast from rank0. This scheme guarantees that intra-chip clocks will be stable before they are used to capture a command on the target rank.

At point 338, chipID matching occurs firing the CHIPIDEnCmdBurst 236 firing the ClkRxEn 262 on rank1 at point 340. The ClkRxEn 262 never wakes on rank0 as there is no need as there is no command burst on rank0. At point 342, the clocks from TSV for rank1 wakes up.

The command is launched at cycle 4 (or any other suitable cycle) and arrives on rank1 at point 344. As previously noted, this may occur naturally after the chipID matches the stackID without delaying the command and/or clocks arriving at rank1. Finally, the command is successfully captured at point 346 and used to complete the operation indicated by the command.

The disable mechanism is simpler than the foregoing enable sequences. Once the command has shifted through the state machine on rank1 with no further commands in the pipeline, the burst-in-progress turns off (e.g., lapses) traveling back to rank0 and disabling the clock transmitter of rank0 shutting down all derivative clocks across all ranks.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

Figure 8:
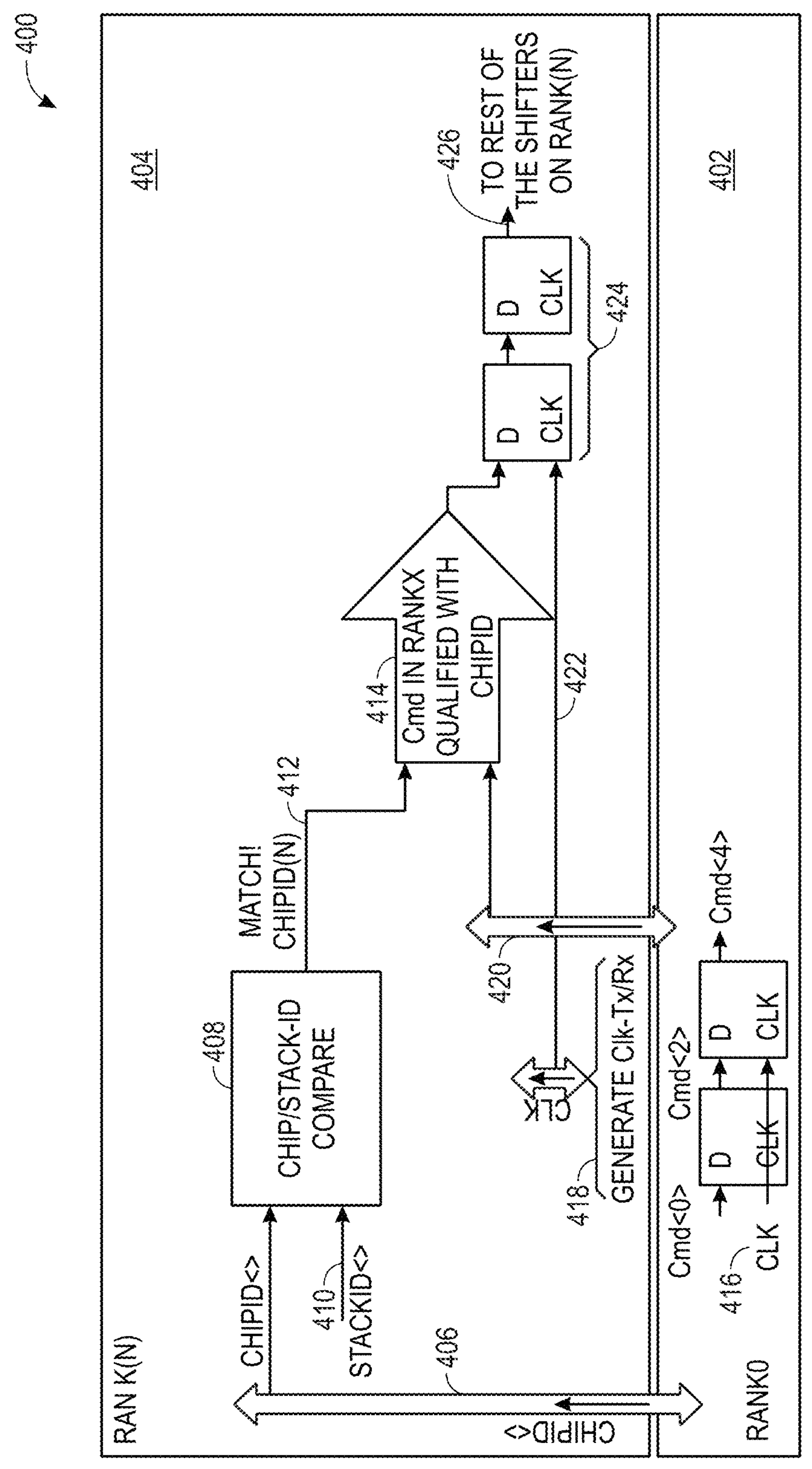
FIG. 8 is a block diagram of a gated clock topology used in the clock gating of FIGS. 4 and 5, according to an embodiment of the present disclosure.

FIG. 8 is a block diagram 400 showing operation of the memory device with gating of intra-chip clocks. Specifically, the block diagram 400 may be a portion of the memory device 10 that includes a rank0 chip 402 and one or more non-rank0 chips 404. As illustrated, the rank0 chip 402 sends a ChipID 406 to the non-rank0 chip(s) 404 without shifting or delaying the chipID. Indeed, the ChipID 406 may be sent to the non-rank0 chip(s) 404 in the same cycle. In compare circuitry 408, the non-rank0 chip(s) 404 compare the ChipID 406 to a StackID 410 for the local non-rank0 chip(s) 404 to generate a match signal 412. The command in the non-rank0 chip(s) 404 is then sent and qualified with the ChipID 406. As noted, the command is delayed separately from the ChipID 406 using a clock 416 and shifters 418. As illustrated, the shifters 418 may include flip-flops that shift the command on a single edge (e.g., rising edge) of the clock 416 that is a double-data rate clock to double the shift rate (e.g., 4 clock cycles using two flip-flops). A delayed command 420 is qualified with the ChipID 414 as qualified command 414 and transmitted to shifters 424 in the non-rank0 chip(s) 404. The clock 416 is transmitted across the ranks/chips based on the ClkTxEn 234 and the ClkRxEn 262 generated by the clock circuitry 200 of the bank control 22 as previously discussed. The ClkTxEn 234 and the ClkRxEn 262 are generated during cycles in which the command is shifted (e.g., cycles 0 to 4). The output 426 of the shifters 424 may be used by any other shifters on the target die, such as the Read-Modify-Write state machine or the RD/WR-AutoPrecharge state machine.

In some embodiments, the clock gating may have impacts on standardized vendor-specific IDD sequences for the memory device 10. For IDD sequences where the stack is in a BankIdle state when using clock gating consumes less power than ungated clocking schemes because the clock transmitter of rank0 chips remain disabled. For IDD sequences where the stack is in an active state without issuing a command (e.g., RD/WR/WRP) that requires clocking/shifting in rank1 chips, the clock transmitter of rank0 remains disabled thereby increasing power savings. Even for IDD sequences where the stack is in an active state with a RD/WR/WRP command, the clock transmitter on rank0 chips and the clock receiver on non-rank0 targeted chips awaken and/or activate when needed thereby saving power of the clock not running continuously. Additionally, since the command is not shifted in non-rank0 to mimic matching delays in matching the ChipID and the StackID, power is also saved.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:

a first memory chip comprising a first plurality of memory banks, a command input configured to receive a command and a chip identifier, and a decoder configured to determine whether the command is to use a clock on a second memory chip when the command matches predetermined conditions;

the second memory chip comprising a second plurality of memory banks and a clock receiver configured to receive the clock from the first memory chip to be used in memory operations on the second memory chip, wherein the first memory chip acts a base chip for a stack of memory chips that includes the first memory chip and the second memory chip, and when the command matches the predetermined conditions, the first memory chip is configured to send the chip identifier to the second memory chip to the clock receiver to activate the clock receiver before transmitting the command to the second memory chip.

2. The semiconductor device of claim 1, wherein the predetermined conditions comprise decoding that the command is a command that uses a command or clock shift in the second memory chip.

3. The semiconductor device of claim 2, wherein the command comprises a write command or a write pattern command.

4. The semiconductor device of claim 2, wherein the command comprises a read auto-precharge command or a write auto-precharge command.

5. The semiconductor device of claim 1, wherein the predetermined conditions comprise one or more command/address bits matching a predefined pattern.

6. The semiconductor device of claim 5, wherein the predefined pattern corresponds to commands where the command is to be shifted for use on the second memory chip.

7. The semiconductor device of claim 1, wherein the first memory chip comprises a plurality of shifters configured to receive the command and to shift the command on the first memory chip.

8. The semiconductor device of claim 7, wherein the second memory chip comprises matching circuitry configured to determine that the second memory chip matches a target identifier for the command.

9. The semiconductor device of claim 8, wherein the determination of matching on the second memory chip and the shifting of the command in the plurality of shifters on the first memory chip at least partially overlap in time.

10. The semiconductor device of claim 9, wherein an amount of delay added in the plurality of shifters is a first number of cycles that is at least as long as a second number of cycles used to complete the determination of matching.

11. The semiconductor device of claim 10, wherein the first number of cycles is less than tCCD_S for the semiconductor device.

12. The semiconductor device of claim 11, wherein the first number is four.

13. The semiconductor device of claim 9, wherein an amount of delay added in the plurality of shifters is based at least in part on a speed grade of the semiconductor device.

14. The semiconductor device of claim 1, wherein the first memory chip comprises first control circuitry configured to control a clock transmitter that is configured to be selectively transmitted from the first memory chip to the second memory chip, and the second memory chip comprises second control circuitry to control the clock receiver to selectively receive the clock transmitter at the second memory chip.

* * * * *